United States Patent
Braganca et al.

(10) Patent No.: US 8,379,352 B1
(45) Date of Patent: Feb. 19, 2013

(54) THERMAGNONIC SPIN-TORQUE OSCILLATOR(STO) AND SENSOR UTILIZING SAME TO DETECT SHIFTS IN THE FREE LAYER MAGNETIZATION OSCILLATION FREQUENCY

(75) Inventors: Patrick Mesquita Braganca, San Jose, CA (US); Bruce Alvin Gurney, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 13/228,429

(22) Filed: Sep. 8, 2011

(51) Int. Cl.
G11B 5/39 (2006.01)
G11C 11/14 (2006.01)

(52) U.S. Cl. ..................... 360/324.2; 365/171
(58) Field of Classification Search ....... 360/324–324.2; 257/421–427; 324/244–263; 365/145, 158, 365/171–173; 428/810–816
See application file for complete search history.

(56) References Cited

U.S. PATENT DOCUMENTS

| | | | |
|---|---|---|---|
| 7,042,685 B2 | 5/2006 | Covington | |
| 7,110,287 B2 | 9/2006 | Huai et al. | |
| 7,471,491 B2 * | 12/2008 | Sato et al. | 360/313 |
| 7,633,699 B2 * | 12/2009 | Kaka et al. | 360/67 |
| 7,826,160 B2 * | 11/2010 | Sato et al. | 360/30 |
| 8,064,246 B2 * | 11/2011 | Slonczewski | 365/158 |
| 2009/0015958 A1 | 1/2009 | Nakamura et al. | |
| 2009/0201614 A1 | 8/2009 | Kudo et al. | |
| 2010/0328799 A1 | 12/2010 | Braganca et al. | |
| 2011/0007431 A1 | 1/2011 | Braganca et al. | |

OTHER PUBLICATIONS

Mojumder et al., "Magnonic spin-transfer torque MRAM with low power, high speed, and error-free switching", Published on Internet at http://arxiv.org/abs/1105.5473v1 (Submitted on May 27, 2011).
Slonczewski, "Initiation of spin-transfer torque by thermal transport from magnons", Phys. Rev. B 82, 054403, Aug. 2010.
Mizushima, et al., "Signal-to-noise ratios in high-signal-transfer-rate read heads composed of spin-torque oscillators", J. Appl. Phys. 107, 063904, Mar. 2010.
Zhu, et al., "Microwave Assisted Magnetic Recording", IEEE Transactions on Magnetics, vol. 44, No. 1, Jan. 2008, pp. 125-131.
Bonetti et al., "Spin torque oscillator frequency versus magnetic field angle: The prospect of operation beyond 65 GHz", Applied Physics Letters 94, 102507, Mar. 2009.

* cited by examiner

*Primary Examiner* — Allen Heinz
(74) *Attorney, Agent, or Firm* — Thomas R. Berthold

(57) ABSTRACT

A "thermagnonic" spin-torque oscillator (STO) uses heat flow alone to cause the spin-torque (ST) effect and generate the persistent oscillation of the free layer magnetization. In addition to the conventional free and reference layers, the thermagnonic STO also includes a magnetic oxide layer having a fixed in-plane magnetization, a ferromagnetic metallic layer on one surface of the magnetic oxide layer, a nonmagnetic electrically conductive layer between the free layer and the metallic layer, and an electrically resistive heater on the other surface of the magnetic oxide layer. Due to the thermagnonic effect, heat flow from the magnetic oxide layer through the metallic layer, conductive layer and free layer ultimately results in a spin transfer torque (STT) to the free layer. Electrical sense current flowing in the opposite direction as the heat flow is used to monitor the frequency of oscillation of the free layer magnetization.

24 Claims, 5 Drawing Sheets

THERMAGNONIC SPIN-TORQUE OSCILLATOR(STO) AND SENSOR UTILIZING SAME TO DETECT SHIFTS IN THE FREE LAYER MAGNETIZATION OSCILLATION FREQUENCY

BACKGROUND OF THE INVENTION

1. Field of the Invention

The invention relates generally to a spin-torque oscillator (STO), and more particularly to a magnetic field sensor and sensing system that uses a STO sensor.

2. Background of the Invention

One type of conventional magnetoresistive (MR) sensor used as the read head in magnetic recording disk drives is a "spin-valve" sensor based on the giant magnetoresistance (GMR) effect. A GMR spin-valve sensor has a stack of layers that includes two ferromagnetic layers separated by a nonmagnetic electrically conductive spacer layer, which is typically copper (Cu). One ferromagnetic layer adjacent the spacer layer has its magnetization direction fixed, such as by being pinned by exchange coupling with an adjacent antiferromagnetic layer, and is referred to as the reference layer. The other ferromagnetic layer adjacent the spacer layer has its magnetization direction free to rotate in the presence of an external magnetic field and is referred to as the free layer. With a sense current applied to the sensor, the rotation of the free-layer magnetization relative to the reference-layer magnetization due to the presence of an external magnetic field, such as from the recorded magnetic bits on the disk, is detectable as a change in electrical resistance. If the sense current is directed perpendicularly through the planes of the layers in the sensor stack, the sensor is referred to as a current-perpendicular-to-the-plane (CPP) sensor.

In addition to CPP-GMR read heads, another type of CPP sensor is a magnetic tunnel junction sensor, also called a tunneling MR or TMR sensor, in which the nonmagnetic spacer layer is a very thin nonmagnetic tunnel barrier layer. In a CPP-TMR sensor the tunneling current perpendicularly through the layers depends on the relative orientation of the magnetizations in the two ferromagnetic layers. In a CPP-GMR read head the nonmagnetic spacer layer is formed of an electrically conductive material, typically a metal such as Cu or Ag. In a CPP-TMR read head the nonmagnetic spacer layer is formed of an electrically insulating material, such as $TiO_2$, MgO or $Al_2O_3$.

In CPP MR sensors, it is desirable to operate the sensors at a high sense current density to maximize the signal and signal-to-noise ratio (SNR). However, it is known that CPP MR sensors are susceptible to current-induced noise and instability. The spin-polarized sense current flows perpendicularly through the ferromagnetic layers and produces a spin-torque (ST) effect on the local magnetization. This can produce fluctuations of the free layer magnetization, resulting in substantial low-frequency magnetic noise if the sense current is large. More recently, it has been suggested that the ST effect can be caused by a thermal gradient wherein magnons created in an insulating ferrite are converted to an electron spin current in a ferromagnetic layer. [Slonczewski, "Initiation of spin-transfer torque by thermal transport from magnons", *Physical Review B* 82. 054403 (2010)].

A spin-torque oscillator (STO) is a device that operates at a current greater than $I_c$ to take advantage of the ST-induced forces acting on the free layer. When a fixed direct current higher than $I_c$ is directed through the STO, a persistent oscillation of the magnetization of the free layer occurs by virtue of the ST effect. A STO sensor based on a CPP-GMR or CPP-TMR sensor has been proposed. In a STO magnetic field sensor the oscillation frequency of the free layer magnetization shifts with the application of an external magnetic field, and these frequency shifts can be used to detect changes in the external magnetic field. In a STO sensor based on a CPP-GMR or CPP-TMR sensor the current through the sensor drives the persistent oscillation of the free layer magnetization and is also used to sense frequency shifts in the free layer magnetization oscillation due to external magnetic fields. However, in a STO sensor, because the sense current should not be much greater than the threshold current, which is the current value need to cause persistent oscillation of the free layer magnetization, the output signal amplitude output is limited. US 20100328799 A1, assigned to the same assignee as this application, and US 20090201614 A1 describe proposed STO sensors for use as read heads in magnetic recording disk drives.

What is needed is a STO that enables monitoring of the oscillation frequency of the free layer magnetization and a STO sensor that that senses shifts in the frequency of oscillation of the free layer magnetization, wherein the STO and STO sensor have a high output signal amplitude not limited by the threshold current.

SUMMARY OF THE INVENTION

The STO according to the present invention is a "thermagnonic" STO that uses heat flow alone to cause the ST effect and generate the persistent oscillation of the free layer magnetization. The thermagnonic STO can also function as an STO magnetic field sensor, such as a magnetic recording disk drive read head. In addition to the conventional free and reference layers, the thermagnonic STO also includes a magnetic oxide layer having a fixed in-plane magnetization, a ferromagnetic metallic layer on one surface of the magnetic oxide layer, a nonmagnetic electrically conductive layer between the free layer and the metallic layer, and an electrically resistive heater on the other surface of the magnetic oxide layer. Due to the thermagnonic effect, heat flow from the magnetic oxide layer through the metallic layer, conductive layer and free layer ultimately results in a spin transfer torque (STT) to the free layer. Electrical sense current flowing in the opposite direction as the heat flow is used to monitor the frequency of oscillation of the free layer magnetization. Because the sense current electron flow is in the same direction as the heat flow, the electron current does not exert appreciable spin-torque on the free layer. In this way the flow of heat provides a means of generating ST on the free layer that is independent of the charge current flow used to sense the oscillation. This allows for a large charge current to be applied which results in large STO power, much larger than if the spin current associated with charge current flow alone were used to generate oscillations.

For a fuller understanding of the nature and advantages of the present invention, reference should be made to the following detailed description taken together with the accompanying figures.

DETAILED DESCRIPTION OF THE INVENTION

The STO according to the invention has applications other than as a magnetic field sensor, but will be described in detail below as magnetic recording disk drive read head.

Figure 1:
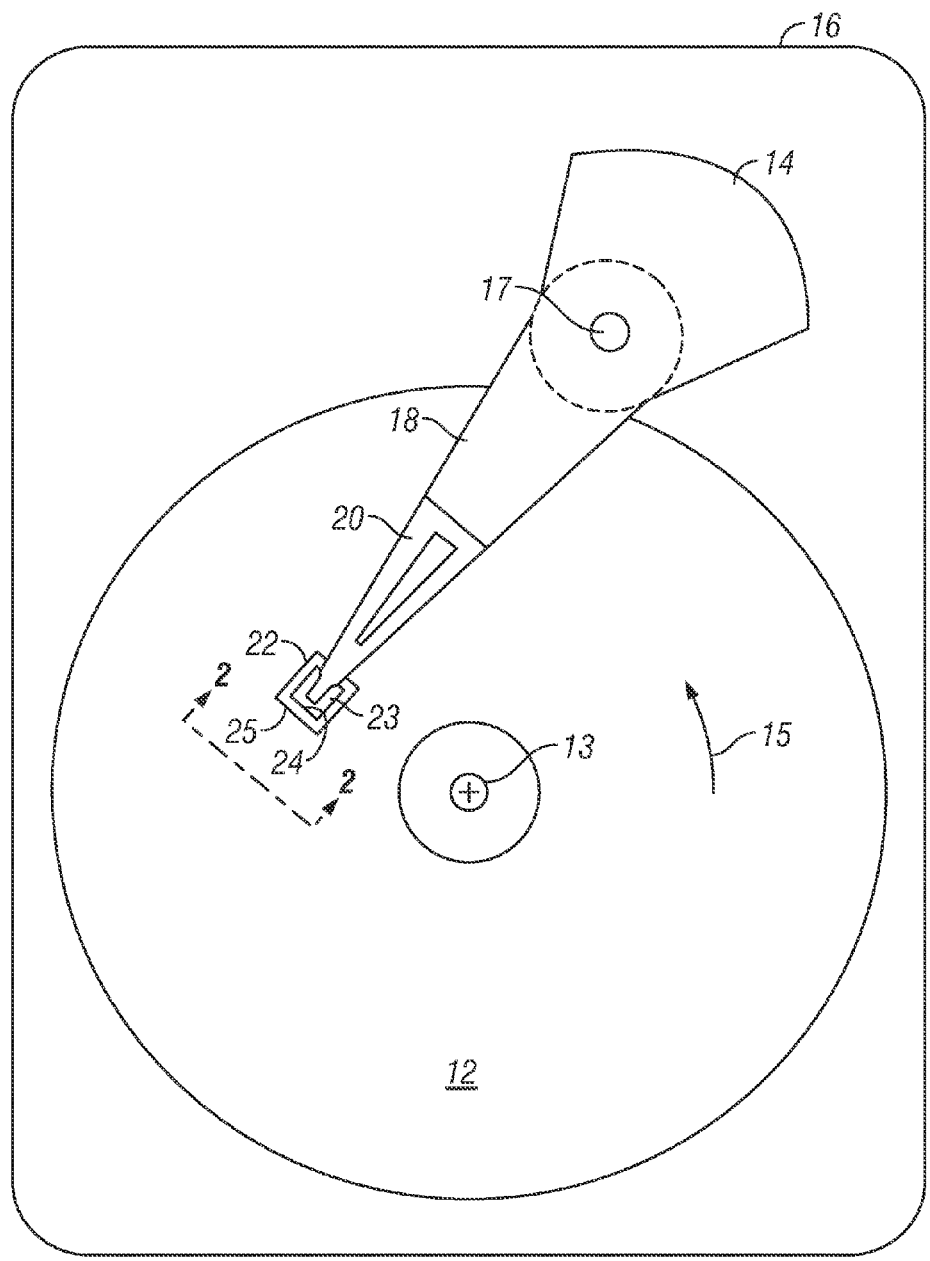
FIG. 1 is a schematic top view of a conventional magnetic recording hard disk drive with the cover removed.

FIGS. 1-4 illustrate a conventional CPP magnetoresistive (MR) magnetic field sensing sensor and system. FIG. 1 is a block diagram of a conventional magnetic recording hard disk drive. The disk drive includes a magnetic recording disk 12 and a rotary voice coil motor (VCM) actuator 14 supported on a disk drive housing or base 16. The disk 12 has a center of rotation 13 and is rotated in direction 15 by a spindle motor (not shown) mounted to base 16. The actuator 14 pivots about axis 17 and includes a rigid actuator arm 18. A generally flexible suspension 20 includes a flexure element 23 and is attached to the end of arm 18. A head carrier or air-bearing slider 22 is attached to the flexure 23. A magnetic recording read/write head 24 is formed on the trailing surface 25 of slider 22. The flexure 23 and suspension 20 enable the slider to "pitch" and "roll" on an air-bearing generated by the rotating disk 12. Typically, there are multiple disks stacked on a hub that is rotated by the spindle motor, with a separate slider and read/write head associated with each disk surface.

Figure 2:
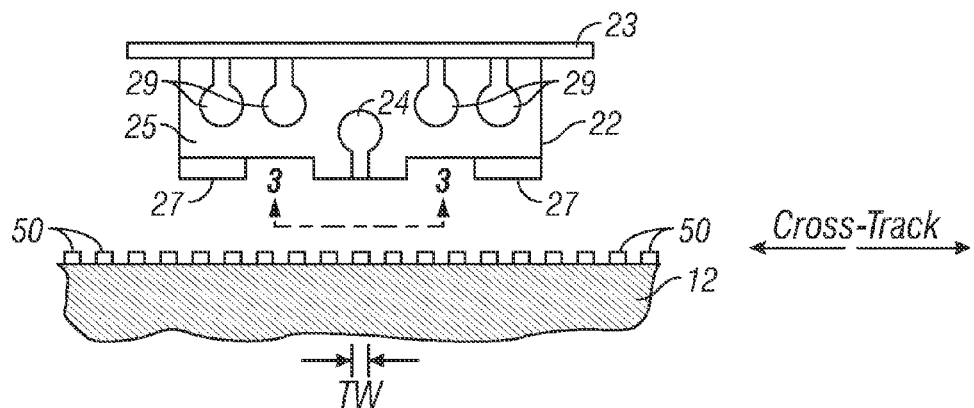
FIG. 2 is an enlarged end view of the slider and a section of the disk taken in the direction 2-2 in FIG. 1.

FIG. 2 is an enlarged end view of the slider 22 and a section of the disk 12 taken in the direction 2-2 in FIG. 1. The slider 22 is attached to flexure 23 and has an air-bearing surface (ABS) 27 facing the disk 12 and a trailing surface 25 generally perpendicular to the ABS. The ABS 27 causes the airflow from the rotating disk 12 to generate a bearing of air that supports the slider 20 in very close proximity to or near contact with the surface of disk 12. The read/write head 24 is formed on the trailing surface 25 and is connected to the disk drive read/write electronics by electrical connection to terminal pads 29 on the trailing surface 25. As shown in the sectional view of FIG. 2, the disk 12 is a patterned-media disk with discrete data tracks 50 spaced-apart in the cross-track direction, one of which is shown as being aligned with read/write head 24. The discrete data tracks 50 have a track width TW in the cross-track direction and may be formed of continuous magnetizable material in the circumferential direction, in which case the patterned-media disk 12 is referred to as a discrete-track-media (DTM) disk. Alternatively, the data tracks 50 may contain discrete data islands spaced-apart along the tracks, in which case the patterned-media disk 12 is referred to as a bit-patterned-media (BPM) disk. The disk 12 may also be a conventional continuous-media (CM) disk wherein the recording layer is not patterned, but is a continuous layer of recording material. In a CM disk the concentric data tracks with track width TW are created when the write head writes on the continuous recording layer.

Figure 3:
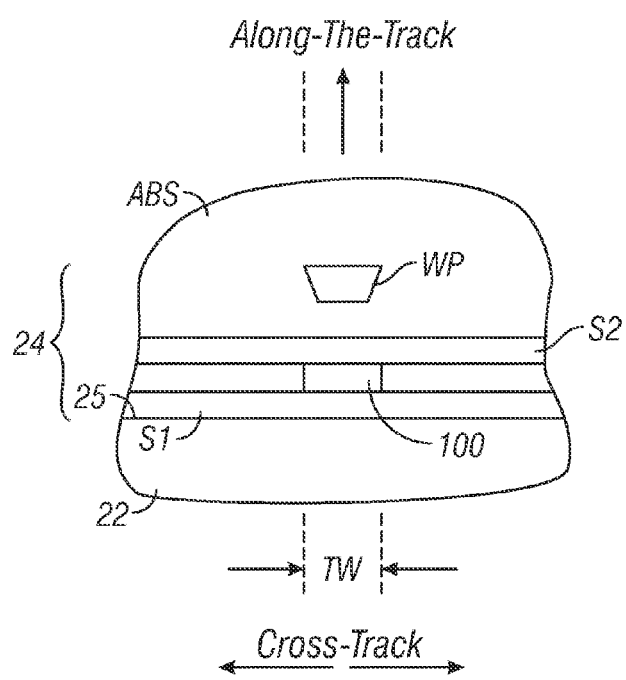
FIG. 3 is a view in the direction 3-3 of FIG. 2 and shows the air-bearing surface (ABS) of the slider with the ends of the read/write head.

FIG. 3 is a view in the direction 3-3 of FIG. 2 and shows the ends of read/write head 24 as viewed from the disk 12. The read/write head 24 is a series of thin films deposited and lithographically patterned on the trailing surface 25 of slider 22. The write head includes a perpendicular magnetic write pole (WP) and may also include trailing and/or side shields (not shown). The CPP MR sensor or read head 100 is located between two magnetic shields S1 and S2. The shields S1, S2 are formed of magnetically permeable material, typically a NiFe alloy, and may also be electrically conductive so they can function as the electrical leads to the read head 100. The shields function to shield the read head 100 from recorded data bits that are neighboring the data bit being read. Separate electrical leads may also be used, in which case the read head 100 is formed in contact with layers of electrically conducting lead material, such as tantalum, gold, or copper, that are in contact with the shields S1, S2. FIG. 3 is not to scale because of the difficulty in showing very small dimensions. Typically each shield S1, S2 is several microns thick in the along-the-track direction, as compared to the total thickness of the read head 100 in the along-the-track direction, which may be in the range of 20 to 40 nm.

Figure 4:
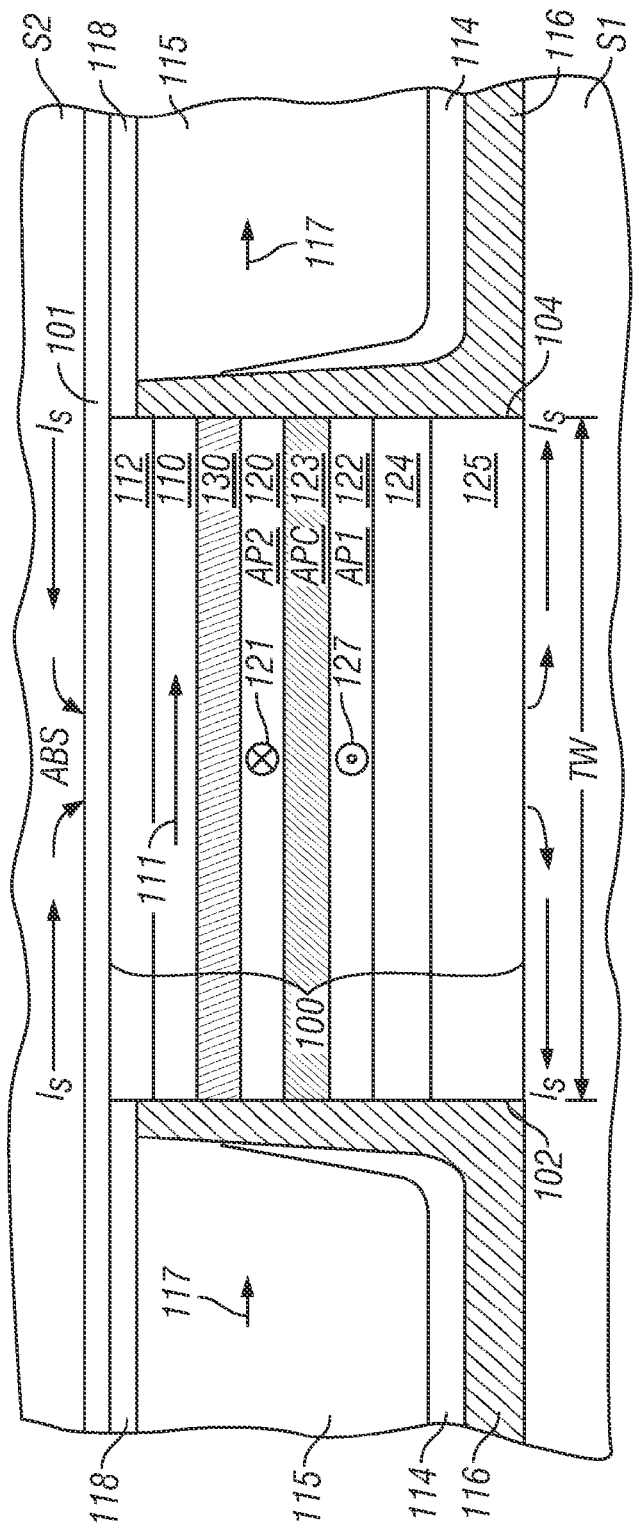
FIG. 4 is a cross-sectional schematic view of the ABS of a current-perpendicular-to-the-plane magnetoresistive (CPP MR) read head showing the stack of layers located between the magnetic shield layers according to the prior art.

FIG. 4 is a view of the ABS showing the layers making up a CPP MR sensor structure as would be viewed from the disk. Sensor 100 is a CPP MR read head comprising a stack of layers formed between the two magnetic shield layers S1, S2. The sensor 100 has a front edge at the ABS and spaced-apart side edges 102, 104 that define the track width (TW). The shields S1, S2 are formed of electrically conductive material and thus may also function as electrical leads for the sense current $I_s$, which is directed generally perpendicularly through the layers in the sensor stack. Alternatively, separate electrical lead layers may be formed between the shields S1, S2 and the sensor stack. The lower shield S1 is typically polished by chemical-mechanical polishing (CMP) to provide a smooth substrate for the growth of the sensor stack. A seed layer 101, such as a thin Ru/NiFe bilayer, is deposited, typically by sputtering, below S2 to facilitate the electroplating of the relatively thick S2.

The sensor 100 layers include a reference ferromagnetic layer 120 having a fixed magnetic moment or magnetization direction 121 oriented transversely (into the page), a free ferromagnetic layer 110 having a magnetic moment or magnetization direction 111 that can rotate in the plane of layer 110 in response to transverse external magnetic fields from the disk 12, and a nonmagnetic spacer layer 130 between the reference layer 120 and free layer 110. The CPP MR sensor 100 may be a CPP GMR sensor, in which case the nonmagnetic spacer layer 130 would be formed of an electrically conducting material, typically a metal like Cu, Au or Ag. Alternatively, the CPP MR sensor 100 may be a CPP tunneling MR (CPP-TMR) sensor, in which case the nonmagnetic spacer layer 130 would be a tunnel barrier formed of an electrically insulating material, like $TiO_2$, MgO or $Al_2O_3$.

The pinned ferromagnetic layer in a CPP MR sensor may be a single pinned layer or an antiparallel (AP) pinned structure like that shown in FIG. 4. An AP-pinned structure has first (AP1) 122 and second (AP2) 120 ferromagnetic layers separated by a nonmagnetic antiparallel coupling (APC) layer 123 with the magnetization directions of the two AP-pinned ferromagnetic layers oriented substantially antiparallel. The AP2 layer 120, which is in contact with the nonmagnetic APC layer 120 on one side and the sensor's electrically nonmagnetic spacer layer 130 on the other side, is typically referred to as the reference layer. The AP1 layer 122, which is typically in contact with an antiferromagnetic layer 124 or hard magnet pinning layer on one side and the nonmagnetic APC layer 123 on the other side, is typically referred to as the pinned layer. The AP-pinned structure minimizes the net magnetostatic coupling between the reference/pinned layers and the CPP MR free ferromagnetic layer. The AP-pinned structure is sometimes also called a "laminated" pinned layer or a synthetic antiferromagnet (SAF).

The pinned layer in the CPP GMR sensor in FIG. 4 is a well-known AP-pinned structure with reference ferromagnetic layer 120 (AP2) and a lower ferromagnetic layer 122 (AP1) that are antiferromagnetically coupled across an AP coupling (APC) layer 123. The APC layer 123 is typically Ru, Ir, Rh, Cr or alloys thereof. The AP1 and AP2 layers, as well as the free ferromagnetic layer 110, are typically formed of crystalline CoFe or NiFe alloys, or a multilayer of these materials, such as a CoFe/NiFe bilayer. The AP1 and AP2 ferromagnetic layers have their respective magnetization directions 127, 121 oriented antiparallel. The AP1 layer 122 may have its magnetization direction pinned by being exchange-coupled to an antiferromagnetic (AF) layer 124 as shown in FIG. 4. The AF layer 124 is typically a Mn alloy, e.g., PtMn, NiMn, FeMn, IrMn, PdMn, PtPdMn or RhMn. Alternatively, the AP-pinned structure may be "self-pinned". In a "self pinned" sensor the AP1 and AP2 layer magnetization directions 127, 121 are typically set generally perpendicular to the disk surface by magnetostriction and the residual stress that exists within the fabricated sensor. It is desirable that the AP1 and AP2 layers have similar moments. This assures that the net magnetic moment of the AP-pinned structure is small so that magnetostatic coupling to the free layer 110 is minimized and the effective pinning field of the AF layer 124, which is approximately inversely proportional to the net moment of the AP-pinned structure, remains high.

A seed layer 125 may be located between the lower shield layer S1 and the AP-pinned structure. If AF layer 124 is used, the seed layer 125 enhances the growth of the AF layer 124. The seed layer 125 is typically one or more layers of NiFeCr, NiFe, Ta, Cu or Ru. A capping layer 112 is located between the free ferromagnetic layer 110 and the upper shield layer S2. The capping layer 112 provides corrosion protection and may be a single layer or multiple layers of different materials, such as Ru, Ta, Ti, or a Ru/Ta/Ru, Ru/Ti/Ru, or Cu/Ru/Ta trilayer.

A ferromagnetic biasing layer 115, such as a CoPt or CoCrPt hard magnetic bias layer, is also typically formed outside of the sensor stack near the side edges 102, 104 of the sensor 100. The biasing layer 115 is electrically insulated from side edges 102, 104 of sensor 100 by insulating layer 116. An optional seed layer 114, such as a Cr alloy like CrMo or CrTi, may be deposited on the insulating layer 116 to facilitate the growth of the biasing layer 115, particularly if the biasing layer is a CoPt or CoPtCr layer. A capping layer 118, such as layer of Cr, or a multilayer of Ta/Cr is deposited on top of the biasing layer 115. The upper layer of capping layer 118, for example Cr, also serves the purpose as a chemical-mechanical-polishing (CMP) stop layer during fabrication of the sensor. The biasing layer 115 has a magnetization 117 generally parallel to the ABS and thus longitudinally biases the magnetization 111 of the free layer 110. Thus in the absence of an external magnetic field its magnetization 117 is parallel to the magnetization 111 of the free layer 110. The ferromagnetic biasing layer 115 may be a hard magnetic bias layer or a ferromagnetic layer that is exchange-coupled to an antiferromagnetic layer. A seed layer 101, such as a NiFe layer, for the shield layer S2 may be located over the sensor 100 and capping layer 118.

In the presence of an external magnetic field in the range of interest, i.e., magnetic fields from recorded data on the disk 12, the magnetization direction 111 of free layer 110 will rotate while the magnetization direction 121 of reference layer 120 will remain substantially fixed and not rotate. The rotation of the free-layer magnetization 111 relative to the reference-layer magnetization 121 results in a change in electrical resistance. Hence, when a sense direct current $I_s$ is directed through the stack of layers in sensor 100, the resistance change is detected as a voltage signal proportional to the strength of the magnetic signal fields from the recorded data on the disk. The sense current flows perpendicularly through the ferromagnetic layers and produces a spin-torque (ST) effect on the local magnetization. If $I_s$ is greater than some critical current ($I_c$) the ST effect can produce gyrations or fluctuations of the free layer magnetization. More recently, it has been suggested that the ST effect can be caused by a thermal gradient wherein magnons created in an insulating ferrite are converted to an electron spin current in a ferromagnetic layer. [Slonczewski, "Initiation of spin-transfer torque by thermal transport from magnons", *Physical Review B* 82. 054403 (2010)].

A spin-torque oscillator (STO) is a device that operates at a current greater than $I_c$ to take advantage of the ST-induced forces acting on the free layer. When a fixed direct current higher than L is directed through the STO with a proper choice of layers, a persistent oscillation of the magnetization of the free layer occurs by virtue of the ST effect. A STO sensor based on a CPP-GMR or CPP-TMR sensor has been proposed. In a STO magnetic field sensor the oscillation frequency of the free layer magnetization shifts with the application of an external magnetic field, and these frequency shifts can be used to detect changes in the external magnetic field. Thus, STO magnetic field sensors have been proposed for use as read heads in magnetic recording disk drives to replace conventional CPP-GMR and CPP-TMR read heads, as described for example in US 20100328799 A1 assigned to the same assignee as this application, and in US 20090201614 A1. In a CPP-TMR or CPP-GMR sensor, like those used in commercially available magnetic recording disk drive read heads, the current through the sensor is typically referred to as the sense current because it is used to sense the change in electrical resistance and thus the magnetic fields from the disk. In a STO sensor based on a CPP-GMR or CPP-TMR sensor the current through the sensor may also be referred to as the charge current because, in addition to being used to sense free layer oscillation frequency shifts and thus external magnetic fields, it also generates the flow of electrons that cause the ST effect.

The STO according to the present invention uses heat flow alone to cause the ST effect and generate the persistent oscillation of the free layer magnetization. Electrical sense current flowing in the opposite direction as the heat flow is used to monitor the frequency of oscillation of the free layer magnetization. This "thermagnonic" STO can also function as an STO magnetic field sensor, such as a magnetic recording disk drive read head. The spin current that generates the ST arises from magnons in an insulating ferrite and is decoupled from spin current generated by the sense current. In a conventional STO it is desirable to operate the STO at a charge current level slightly above the threshold current, i.e., the current which just causes persistent oscillation of the free layer magnetization. Thus in the STO of this invention, because the heat flow alone causes the ST effect, the sense current through the STO can be substantially higher than this threshold current and thus produce a higher output signal.

Figure 5:
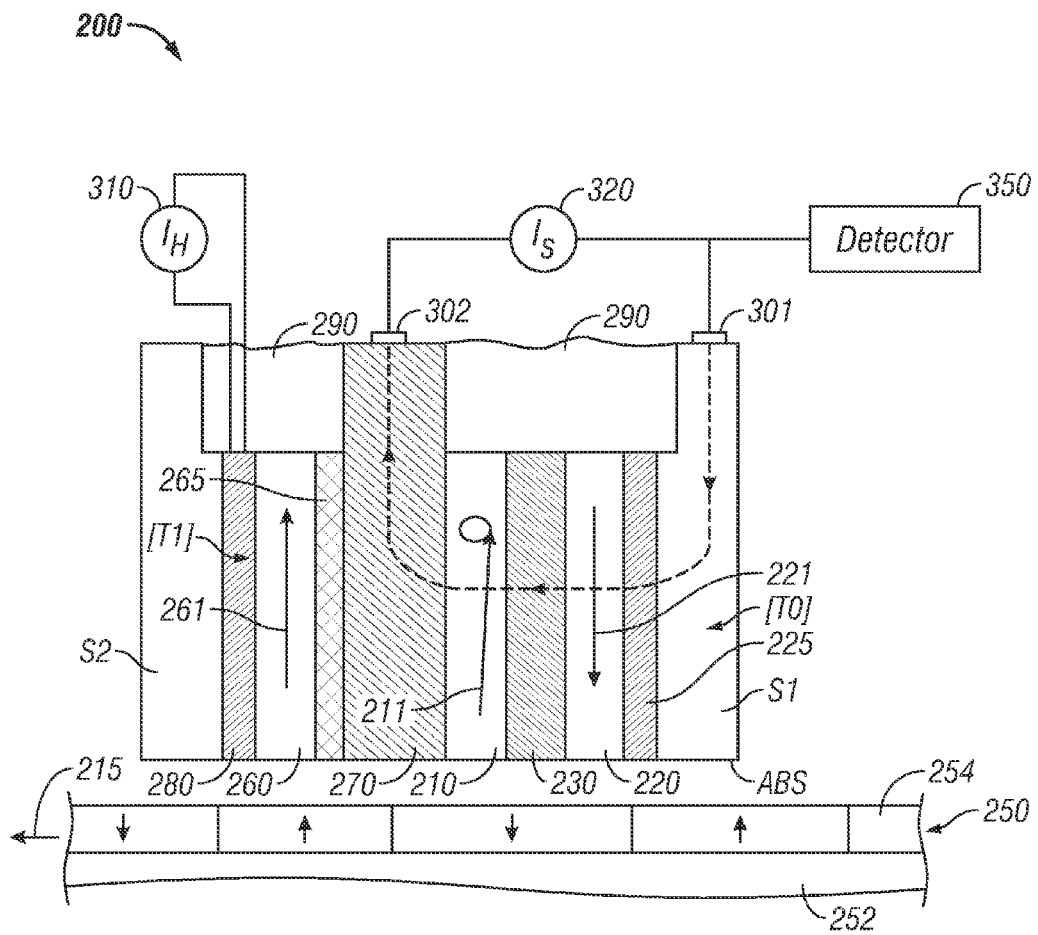
FIG. 5 is a schematic of a thermagnonic spin-torque oscillator (STO) sensing system according to an embodiment of the invention in a magnetic recording disk drive implementation.

FIG. 5 is a schematic of a magnetic field sensing system using a thermagnonic STO sensor 200 according to an embodiment of the invention. The system is illustrated as a magnetic recording disk drive with STO sensor 200 with its ABS facing the disk 250. The sensor 200 includes a set of individual layers and features of a CPP-GMR or CPP-TMR sensor as previously-described with respect to CPP sensor 100.

The disk 250 has a substrate 252 and a recording layer 254 that serves as the magnetic recording medium with magnetized regions depicted by the arrows directed toward or away from the ABS. As the disk rotates, the magnetized regions move in the direction of arrow 215 past the sensor 200. The recording layer 254 is depicted as a perpendicular magnetic recording medium with the regions magnetized perpendicularly to the plane of recording layer 254, but alternatively it may be a longitudinal magnetic recording medium with the regions being magnetized in the plane of recording layer 254.

The STO sensor 200 has a first shield layer S1 that may serve as a substrate for the deposition of the set of layers, a second shield layer S2, and a free ferromagnetic layer 210 that has a substantially in-plane magnetization 211 free to oscillate in the presence of an external magnetic field to be sensed. The free layer 210 is part of a CPP structure with a nonmagnetic spacer layer 230 and a reference layer 220 having a fixed in-plane magnetization 221. The CPP structure may be a CPP-TMR structure wherein spacer layer 230 is an insulating tunnel barrier layer, or a CPP-GMR structure wherein spacer layer 230 is a nonmagnetic conductive spacer layer. The reference layer 220 may be a single pinned layer or the AP2 layer of an AP-pinned structure. Thus the compositions and thicknesses for reference layer 220, spacer layer 230 and free layer 210 may be as described above for CPP-TMR and CPP-GMR structures. A non-ferromagnetic conducting metal layer 225 is located between S1 and reference layer 220 for breaking any magnetic exchange interaction between S1 and reference layer 220 or other ferromagnetic layers in the sensor stack while permitting electrical conduction. Typical materials for layer 225 includes Cu, Ag, Ta and Ru. The thermagnonic STO sensor 200 also includes a magnetic oxide layer 260 having a fixed in-plane magnetization 261, a ferromagnetic metallic layer 265 on one surface of the magnetic oxide layer 260, and a nonmagnetic electrically conductive layer 270 between the free layer 210 and metallic layer 265. In the absence of an external magnetic field the magnetization 211 of free layer 210 should be substantially antiparallel to the magnetizations 221 of the reference layer 220 and parallel to the magnetization 261 of the magnetic oxide layer 260, and substantially perpendicular to the ABS. The magnetization 211 of free layer 210 can point either toward or away from the recording layer 254.

An electrically resistive heater layer 280 is located on the other surface of magnetic oxide layer 265 between the magnetic oxide layer 265 and second shield S2. Materials for use as electrically resistive heater layer 280 include graphite-like carbon, chromium (Cr), nichrome (NiCr), tantalum (Ta) and titanium (Ti). The electrically resistive heater layer 280 is connected to heater circuitry 310 that generates heater current $I_H$ that heats the magnetic oxide layer 280 to a temperature T1 which is greater than the temperature T0 of shield S1. The creates a thermal gradient which causes heat flow from magnetic oxide layer 260 through the metallic layer 265, conductive layer 270 and free layer 210.

Electrical sense current circuitry 320 is connected to S1 via terminal 301 and conductive layer 270 via terminal 302 for generating sense current $I_S$ from S1, through free layer 210 to conductive layer 270. The direction of sense current is opposite to the direction of heat flow. Thus the sense current electron flow is in the same direction as the heat flow, so that the electron current does not exert appreciable spin-torque on the free layer. In this way the flow of heat provides a means of generating spin-torque on the free layer that is independent of the charge current flow used to sense the oscillation. This allows for a large charge current to be applied which will result in large oscillator power, much larger than if the spin current associated with charge current flow alone were used to generate oscillations. It is also possible to flow the charge current in the opposite direction, but typically this would lead to lower oscillator power because lower charge current would be needed to assist the heat-generated spin current to generate the oscillations. A detector 350 is coupled to the circuitry 320 for sense current $I_s$. The detector 350 detects shifts in the free layer magnetization 211 oscillation frequency from a base frequency in response to the external magnetic fields from the magnetized regions of recording layer 254.

The STO sensor 200 includes insulating material 290 in the back region recessed from the ABS for electrically isolating S1, conductive layer 270 and S2 from one another. The order of the sensor layers in the stack may be reversed from what is shown in FIG. 5, with resistive heater layer 280 being deposited first on S1, followed by magnetic oxide layer 260, metallic layer 265, conductive layer 270, free layer 210, nonmagnetic spacer layer 230, reference layer 220 and layer 220, with S2 being located on layer 225.

The magnetic oxide layer 260 is a substantially insulating ferromagnetic ferrite with a thickness in the range of 1 to 20 nm. Thus magnetic oxide layer 260 may be selected from barium ferrite, iron ferrite, yttrium ferrite, cobalt ferrite, nickel zinc ferrite, and chrome oxide. The metallic layer 265 is in direct contact with and located between the magnetic oxide layer 260 and conductive layer 270 and is a ferromagnetic metal or metal alloy. Preferred materials include one or more of Co, Ni, Fe and their alloys, and Heusler alloys containing Mn, such as CoMnGe, CoMnSi and CoMnAl. The metallic layer 265 should be a continuous film so as to cover all of the surface of magnetic oxide layer 260 and thus should be at least 0.5 nm thick, but preferably no greater than its spin diffusion length, which is 2-5 nm in Co, Fe, Ni and their alloys. Layer 265 will typically have a thickness of about 2 nm. The spin diffusion length is the distance over which spin current loses 1/e of its amplitude from scattering. The nonmagnetic conductive layer 270 between the metallic layer 265 and free layer 210 is preferably Cu, but may also be Ag, Au or Al, or alloys thereof. The nonmagnetic conductive layer 270 may have a thickness less than its spin diffusion length, which can be as large as several hundred nm for Al and Cu. For a recording head to maintain a narrow read gap the thickness of layer 270 should be much less, preferably between about 1 and 5 nm.

In the operation of the thermagnonic STO according to the invention, heater layer 280 heats one side of the magnetic oxide layer 260 to a temperature T1>T0 so that heat flows from one side of the magnetic oxide layer to its other side, and to the free layer 210. The temperature gradient generates thermal fluctuations of local spins within the oxide which, due to the exchange interaction between adjacent spins, order into spatially correlated waves known as spin waves. Just as light is a wave and at the same time is made up of individual photons (each carrying a quantum of angular momentum h, where h=h/2π and h is Planck's constant), spin waves are made up of individual magnons (each also carrying a quantum of angular momentum). What is meant by "spin" is the magnetic moment that is the consequence of this angular momentum in a charged particle, like the electron. So each magnon, which is made of up electrons, carries with it one quantum of spin moment (called the Bohr magneton, eh/2 m where e is the electron charge and m is the electron mass). Magnons in the oxide carry spin opposite to the magnetization of the oxide itself. In the device 200 when a magnon arrives at the interface of the magnetic oxide layer 260 with the ferromagnetic metallic layer 265, the ferromagnetic metal acts to transfer one quantum unit of magnetization (magneton) from the magnon into the conduction electrons of the ferromagnetic metal by flipping the spin of one conduction electron (via the spin orbit interaction) This electron will then flow into the nonmagnetic conductive layer 270 and subsequently interact with the ferromagnetic free layer 210. Because there is a net generation of electrons having spins opposite to the magnetization of the interface of the magnetic oxide layer 260 with the ferromagnetic metallic layer 265, and because those electrons have a higher temperature and therefore higher velocity, there is a net spin current from the magnetic oxide layer 260 to the free layer 210 that would be substantially opposite to the nominal free layer magnetization direction when the free and oxide magnetizations are oriented substantially parallel. In addition to thermally driven spin current, the spin concentration gradient can also contribute to the spin current. The concentration difference between where spins are injected into the ferromagnetic metal (high spin concentration) and the free layer (where spin scattering causing low spin concentration) leads to a flow of spins, i.e., a spin current. The dissipation of the spin current which occurs in the free layer 210 results in a spin transfer torque (STT) to the free layer 210. The magnetizations 261, 211 of the magnetic oxide layer 260 and the free layer 210, respectively, are oriented parallel so that the STT generated by the heat flow induces a persistent oscillation of the magnetization 211 of the free layer 210.

The concept of thermal transport from magnons for generating STT is described in more detail in the previously cited paper by Slonczewski. Slonczewski estimates that the efficiency of thermagnonic STT may be up to 60-80 times more efficient than STT by charge current. Thus a temperature difference of between 10 to 100° C. between the magnetic oxide layer 260/metallic layer 265 interface and the free layer 210 will provide sufficient STT to cause persistent oscillation of the free layer magnetization 211. In the thermagnonic STO of this invention, the sense current direction is opposite the direction which would be selected if it were desired to cause persistent oscillation of the free layer magnetization by charge current alone. The desirable operating point of charge current in a conventional STO driven by charge current alone is just above the threshold current, which is between about 0.2 and 1 mA for a 30 nm×30 nm device. However, for similar devices of the same size operated as CPP-GMR devices, the sense current limit is about 3 mA or more. Thus a factor of 3 to 10 improvement in sense current over that used in CPP-GMR devices, and thus also in output signal amplitude, can be achieved with the thermagnonic STO according to the invention.

As one example of a disk drive STO sensor according to the invention, if the persistent oscillation of the free layer magnetization were to be driven by charge current alone, the threshold current density would be about $1-2\times10^7$ A/cm$^2$. An electrically resistive heater that generates a thermal gradient from the magnetic oxide layer/metallic layer interface to the free layer of about 20° C. would be sufficient to generate persistent oscillation of the free layer magnetization at a resonance or base frequency of about 4-8 GHz (depending on the saturation magnetization of the ferromagnetic material used) in the absence of an external magnetic field. The positive and negative magnetizations in the recording layer 254 may generate magnetic fields of 100-500 Oe at the height at which the sensor passes above the media and pass the free layer 210 at a frequency of up to 2 GH. This field would cause shifts in the base frequency of oscillation of the magnetization 211 of free layer 210 of about ±1 GHz. The sense current density may be up to about $2\times10^8$ A/cm$^2$, which is well above the threshold current density. The detector 350 can measure the frequency of oscillation of the free layer magnetization by measuring the change in electrical resistance. In one detection technique, the frequency modulation (FM) signal from the free layer magnetization oscillations is converted to a train of voltage pulses (a digital signal) and a delay detection method is employed for the FM detection. (K. Mizushima, et al., "Signal-to-noise ratios in high-signal-transfer-rate read heads composed of spin-torque oscillators", *J. Appl. Phys.* 107, 063904 2010).

Figure 6:
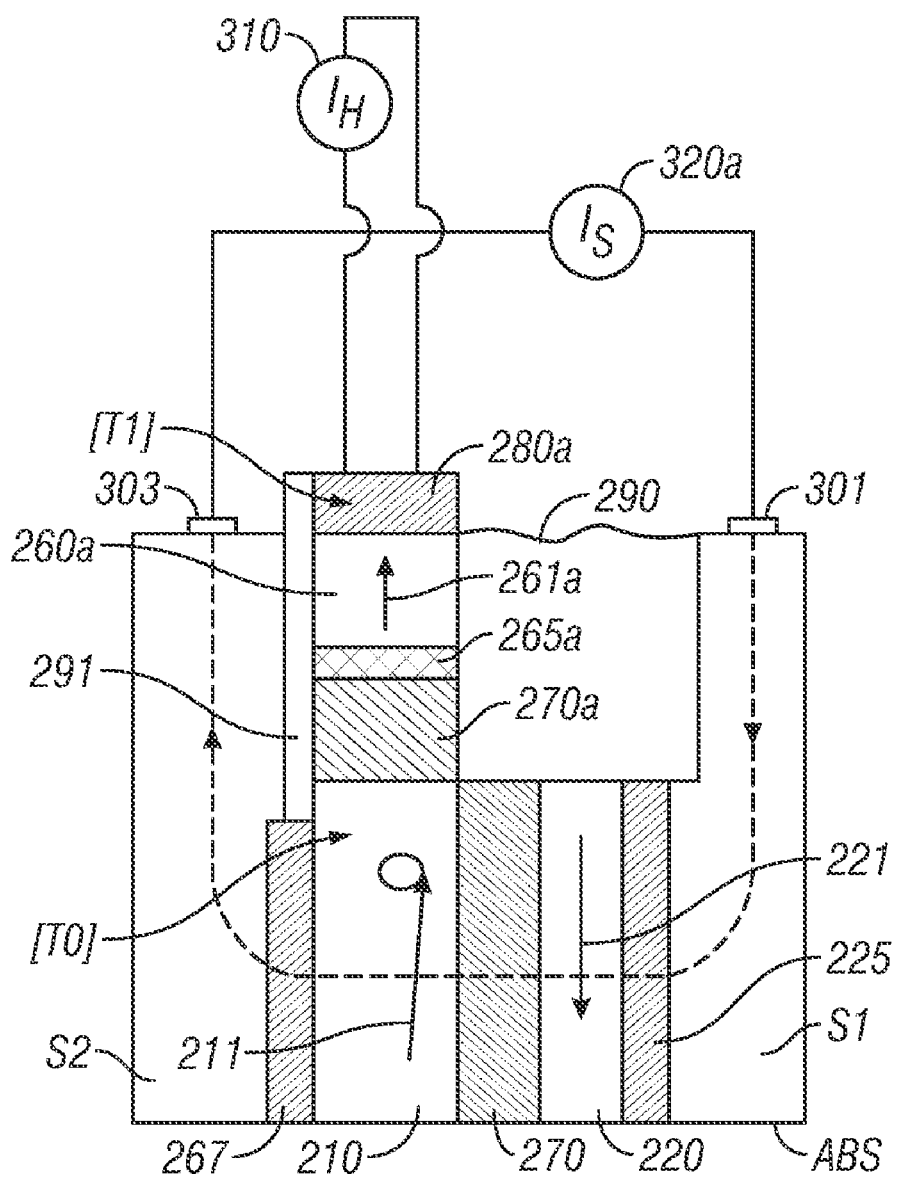
FIG. 6 is a schematic of the embodiment of FIG. 5 wherein certain of the layers in the STO sensor stack are located substantially in the plane of the free layer.

For magnetic recording applications it is desirable to fit the STO sensor layers as a stack of layers into as narrow a space as possible between the magnetic shields to achieve the highest spatial resolution of the recorded magnetic bits in the along-the-track direction (parallel to the direction of arrow 215 in FIG. 5). FIG. 6 shows an embodiment of the thermagnonic STO sensor according to the invention wherein the magnetic oxide layer 260a, metallic layer 265a and nonmagnetic conductive layer 270a are not in the stack but are formed generally in the same plane as the free layer 210. The magnetic oxide layer 260a, metallic layer 265a and nonmagnetic conductive layer 270a are shown recessed from the ABS in FIG. 6, with electrically resistive heater layer 280a recessed further from the ABS than magnetic oxide layer 260a but in contact with one surface of the magnetic oxide layer 260a. An insulator 291, like insulator 290, separates S1 from the layers 260a, 265a, 270a and resistive heater layer 280a. A non-ferromagnetic conducting metal layer 267, like layer 225, is located between S2 and free layer 220 for breaking any magnetic exchange interaction. As an alternative to being recessed from the ABS, the layers 260a, 265a and 270a may be located to either side of the free layer 210 (the cross-track direction) with edges substantially at the ABS, like the edge of free layer 210, and still be generally formed in the same plane as the free layer 210. In either case the S1-S2 shield-to-shield spacing is reduced from the embodiment of FIG. 5. In this embodiment the electrical circuitry 320a for the sense current would be connected between terminals 301, 303 on S1 and S2, respectively, and the current direction through the free layer 210 would be opposite to the direction of heat flow.

As previously mentioned, while the thermagnonic STO according to the invention has been described in detail with application as a magnetic field sensor, in particular a magnetic recording disk drive read head, the invention has other applications. Other applications of the thermagnonic STO, all of which would benefit from being able to use the sense current to detect the frequency or phase of the free layer oscillation include mixers, radio, cell phones and radar (including vehicle radar). See for example, "STO frequency vs. magnetic field angle: The prospect of operation beyond 65 GHz", by Bonetti et al, *APL* 94 102507 (2009).

Still another application is for high-frequency assisted writing in magnetic recording, such as a magnetic recording disk drive. In this technique, also called microwave-assisted magnetic recording (MAMR), the STO applies a high-frequency oscillatory magnetic field to the magnetic grains of the recording layer as a magnetic field auxiliary to the magnetic write field from the conventional write head. The auxiliary field may have a frequency close to the resonance frequency of the magnetic grains in the recording layer to facilitate the switching of the magnetization of the grains at lower write fields from the conventional write head than would otherwise be possible without assisted recording. In one type of MAMR system, a STO based on either GMR or TMR, operates with the magnetization of the reference layer and the magnetization of the free layer, in the absence of an excitation current, oriented perpendicular to the planes of the layers. See for example "Microwave Assisted Magnetic Recording", by J. G. Zhu et al., *IEEE Transactions on Magnetics*, Vol. 44, No. 1, January 2008, pp. 125-131. Thus when the thermagnonic STO according to the invention, like that shown in FIG. 5, is used as a STO for MAMR, the magnetizations 221, 261 of the reference layer 220 and magnetic oxide layer 260, respectively, would be oriented perpendicular to the planes of the layers, and the magnetization 211 of the free layer 210, in the absence of heat flow, would also be oriented perpendicular to the plane of the layer. The sense current $I_s$ is then used to monitor the frequency of the oscillation of the free layer magnetization 211.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A thermagnonic spin-torque oscillator (STO) comprising:
    a substrate;
    a set of layers on the substrate comprising:
        a ferromagnetic reference layer having a fixed magnetization;
        a ferromagnetic free layer having a magnetization capable of oscillation;
        a nonmagnetic spacer layer between the reference layer and the free layer;
        a magnetic oxide layer having a fixed magnetization;
        a ferromagnetic metallic layer in contact with one surface of the magnetic oxide layer; and
        a nonmagnetic electrically conductive layer between the metallic layer and the free layer;
    a heat source coupled to the other surface of the magnetic oxide layer for generating a thermal gradient from said other magnetic oxide layer surface across said magnetic oxide layer and across said metallic layer and nonmagnetic electrically conductive layer to the free layer; and
    electrical terminals for connection of electrical circuitry to supply sense current from the reference layer to the free layer.

2. The STO of claim 1 wherein the magnetization of the magnetic oxide layer is oriented substantially parallel to the magnetization of the free layer, and antiparallel to the magnetization of the reference layer.

3. The STO of claim 1 wherein the heat source is a layer of electrically resistive material and further comprising electrical terminals for connection of the heat source to electrical circuitry.

4. The STO of claim 1 wherein the magnetic oxide layer comprises a substantially insulating ferromagnetic ferrite selected from barium ferrite, iron ferrite, yttrium ferrite, cobalt ferrite, nickel zinc ferrite, and chrome oxide.

5. The STO of claim 1 wherein the ferromagnetic metallic layer comprises a metal or metal alloy selected from one or more of Co, Ni and Fe or a Heusler alloy containing Mn and having a thickness of at least 0.5 nm.

6. The STO according to claim 1 further comprising electrical circuitry connected to said electrical terminals for supplying charge current from the reference layer through the free layer to the nonmagnetic electrically conductive layer.

7. The STO according to claim 1 wherein the nonmagnetic spacer layer is an electrically conducting spacer layer.

8. The STO according to claim 1 wherein the nonmagnetic spacer layer is an electrically insulating tunnel barrier layer.

9. A spin-torque oscillator (STO) sensor for sensing external magnetic fields comprising:
    a substrate;
    a set of layers on the substrate comprising:
        a ferromagnetic reference layer having an in-plane fixed magnetization;
        a ferromagnetic free layer having a magnetization capable of oscillation;
        a nonmagnetic spacer layer between the reference layer and the free layer;
        a magnetic oxide layer having an in-plane fixed magnetization, the magnetizations of the free layer and magnetic oxide layer being substantially antiparallel to the magnetization of the reference layer;
        a ferromagnetic metallic layer in contact with one surface of the magnetic oxide layer;
        a nonmagnetic electrically conductive layer between the metallic layer and the free layer; and
        an electrically resistive heater layer coupled to the other surface of the magnetic oxide layer for directing heat to flow from said other magnetic oxide layer surface across said magnetic oxide layer and across said metallic layer and nonmagnetic electrically conductive layer to the free layer; and
    electrical terminals for connection of electrical circuitry to supply sense current from the reference layer through the free layer to the nonmagnetic electrically conductive layer in a direction opposite to the direction of heat flow.

10. The STO sensor of claim 9 wherein the substrate is a first shield layer of magnetically permeable material and further comprising a second shield layer of magnetically permeable material, the set of layers being located between the first and second shield layers.

11. The STO sensor of claim 10 wherein the set of layers is a stack of layers.

12. The STO sensor of claim 9 wherein the free layer is located in substantially the same plane as the nonmagnetic electrically conductive layer.

13. The STO sensor of claim 12 wherein the magnetic metallic layer and magnetic oxide layer are located in substantially the same plane as the nonmagnetic electrically conductive layer.

14. The STO sensor of claim 9 wherein the magnetic oxide comprises a substantially insulating ferromagnetic ferrite selected from barium ferrite, iron ferrite, yttrium ferrite, cobalt ferrite, nickel zinc ferrite, and chrome oxide.

15. The STO sensor of claim 9 wherein the ferromagnetic metallic layer comprises a metal or metal alloy having a thickness of at least 0.5 nm and selected from one or more of Co, Ni and Fe and a Heusler alloy containing Mn.

16. A magnetic field sensing system comprising:
    the STO sensor of claim 9;
    first electrical circuitry connected to the resistive heater layer for heating the resistive heater layer, the heat from the resistive heater layer causing the magnetization of the free layer to oscillate at a base frequency in the absence of an external magnetic field and in the absence of sense current;
    second electrical circuitry connected couple to the free layer for supplying a sense current through the free layer in a direction opposite to the direction of heat flow through the free layer; and a detector coupled to the sense current circuitry for detecting shifts in the free layer magnetization oscillation frequency from said base frequency in response to external magnetic fields.

17. A disk drive having a magnetic recording disk and a read sensor for reading recorded data from the disk comprising:
- a rotatable magnetic recording disk having magnetized regions providing magnetic fields, the transitions between magnetized regions representing recorded data;
- a carrier for supporting a read sensor near the disk, the carrier having a disk-facing surface;
- first and second magnetically permeable shields on the carrier;
- a read sensor between the first and second shields for detecting the magnetic fields from the magnetized regions on the disk, the read sensor comprising:
   - a ferromagnetic free layer having an in-plane magnetization substantially free to oscillate and oriented in a direction substantially orthogonal to the disk-facing surface of the carrier in the absence of magnetic fields from the disk;
   - a ferromagnetic reference layer not in contact with the free layer and having a fixed in-plane magnetization oriented substantially antiparallel to the magnetization of the free layer in the absence of magnetic fields from the disk;
   - a nonmagnetic spacer layer between the free layer and the reference layer;
   - a magnetic oxide layer having a fixed in-plane magnetization oriented substantially parallel to the magnetization of the free layer in the absence of magnetic fields from the disk;
   - a ferromagnetic metallic layer in contact with one surface of the magnetic oxide layer;
   - a nonmagnetic electrically conductive layer between the metallic layer and the free layer;
- an electrically resistive heater layer coupled to the other surface of the magnetic oxide layer for directing heat to flow from said other magnetic oxide layer surface across said magnetic oxide layer and across said metallic layer and nonmagnetic electrically conductive layer to the free layer, the heat flow causing the magnetization of the free layer to oscillate at a base frequency in the absence of an external magnetic field;
- first electrical circuitry connected to the resistive heater layer for heating the resistive heater layer;
- second electrical circuitry coupled to the free layer for supplying a sense current through the free layer in a direction opposite to the direction of heat flow through the free layer; and
- a detector responsive to the sense current for detecting shifts in the free layer magnetization oscillation frequency from said base frequency in response to magnetic fields from the disk.

18. The disk drive of claim 17 wherein the magnetized regions of the disk are magnetized in a direction substantially perpendicular to the disk.

19. The disk drive of claim 17 wherein the free layer is located in substantially the same plane as the nonmagnetic electrically conductive layer.

20. The disk drive of claim 17 wherein the nonmagnetic electrically conductive layer, the magnetic oxide layer and the metallic layer are recessed from the disk-facing surface of the carrier.

21. The disk drive of claim 17 wherein the magnetic oxide comprises a substantially insulating ferromagnetic ferrite selected from barium ferrite, iron ferrite, yttrium ferrite, cobalt ferrite, nickel zinc ferrite, and chrome oxide.

22. The disk drive of claim 17 wherein the ferromagnetic metallic layer comprises a metal or metal alloy having a thickness of at least 1 nm and selected from one or more of Co, Ni and Fe and a Heusler alloy selected from CoMnGe, CoMnSi and CoMnAl.

23. The disk drive of claim 17 wherein the nonmagnetic spacer layer is an electrically conducting spacer layer.

24. The disk drive of claim 17 wherein the nonmagnetic spacer layer is an electrically insulating tunnel barrier layer.

* * * * *